US008860928B2

(12) United States Patent
Postma et al.

(10) Patent No.: US 8,860,928 B2
(45) Date of Patent: Oct. 14, 2014

(54) LITHOGRAPHIC APPARATUS, COMPUTER PROGRAM PRODUCT AND DEVICE MANUFACTURING METHOD

(75) Inventors: Sytse Postma, Eindhoven (NL); Marcus Adrianus Van De Kerkhof, Helmond (NL); Bearrach Moest, Eindhoven (NL); Vasco Miguel Matias Serrao, Hasselt (BE)

(73) Assignee: ASML Netherlands B.V., Veldhoven (NL)

( * ) Notice: Subject to any disclaimer, the term of this patent is extended or adjusted under 35 U.S.C. 154(b) by 523 days.

(21) Appl. No.: 13/174,013

(22) Filed: Jun. 30, 2011

(65) Prior Publication Data

US 2012/0019795 A1   Jan. 26, 2012

Related U.S. Application Data

(60) Provisional application No. 61/366,799, filed on Jul. 22, 2010.

(51) Int. Cl.
*G03F 9/00* (2006.01)

(52) U.S. Cl.
CPC ............ *G03F 9/7088* (2013.01); *G03F 9/7046* (2013.01)
USPC ................................. 355/77; 356/624; 355/53

(58) Field of Classification Search
CPC ... G03F 9/7088; G03F 9/7046; G03F 9/7003; G03F 7/70358; G03F 9/7026; G03F 9/7007; G03F 7/7085; G03F 7/70666; G03F 9/7092
USPC ......... 355/53, 55, 77; 356/399, 400, 609, 624
See application file for complete search history.

(56) References Cited

U.S. PATENT DOCUMENTS 5,650,840 A * 7/1997 Taniguchi ........................ 355/55
5,985,495 A * 11/1999 Okumura et al. ............... 430/22

(Continued)

FOREIGN PATENT DOCUMENTS

CN   101567302   10/2009
CN   101576715   11/2009

(Continued)

OTHER PUBLICATIONS

Chinese Office Action dated Apr. 24, 2013 in corresponding Chinese Patent Application No. 201110204945.1.

*Primary Examiner* — Steven H Whitesell Gordon
(74) *Attorney, Agent, or Firm* — Pillsbury Winthrop Shaw Pittman LLP

(57) ABSTRACT

Disclosed is a device manufacturing method and associated apparatus, the method comprising transferring a pattern from a patterning device onto a substrate. The method relates to the alignment of said patterning device and said substrate, and comprises imparting a radiation beam onto an alignment structure on said patterning device so as to obtain a resultant aerial image; scanning an image sensor in accordance with a scanning scheme, through a target volume containing said resultant aerial image, the relative positions of said image sensor and said substrate being known or subsequently determined; and measuring features of said image and thereby determining of the location of the alignment structure relative to the image sensor; wherein an alternative scanning scheme is used in which, for example two or more scans through the whole target volume are performed, having a total duration the same as a conventional single continuous scan.

16 Claims, 7 Drawing Sheets

(56) References Cited

U.S. PATENT DOCUMENTS

| | | | |
|---|---|---|---|
| 6,674,510 B1* | 1/2004 | Jasper et al. | 355/55 |
| 7,409,302 B2* | 8/2008 | Kok et al. | 702/56 |
| 2002/0041377 A1* | 4/2002 | Hagiwara et al. | 356/399 |
| 2006/0055904 A1* | 3/2006 | Baselmans | 355/55 |
| 2006/0227310 A1* | 10/2006 | Buurman et al. | 355/55 |
| 2008/0030715 A1* | 2/2008 | Kondo et al. | 356/73 |
| 2011/0090476 A1* | 4/2011 | Van De Kerkhof et al. | 355/53 |

FOREIGN PATENT DOCUMENTS

| | | |
|---|---|---|
| CN | 101614963 | 12/2009 |
| JP | 10-294268 | 11/1998 |
| JP | 10-312961 | 11/1998 |
| JP | 11-251213 | 9/1999 |
| JP | 2002-014005 | 1/2002 |
| TW | 363163 | 7/1999 |
| TW | 490596 | 6/2002 |

* cited by examiner

LITHOGRAPHIC APPARATUS, COMPUTER PROGRAM PRODUCT AND DEVICE MANUFACTURING METHOD

CROSS-REFERENCE TO RELATED APPLICATION

This application claims priority and benefit under 35 U.S.C. §119(e) to U.S. Provisional Patent Application No. 61/366,799, entitled "Lithographic Apparatus, Computer Program Product and Device Manufacturing Method," filed on Jul. 22, 2010. The content of that application is incorporated herein in its entirety by reference.

FIELD

The present invention relates to a lithographic apparatus, computer program product and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In device manufacturing methods using lithographic apparatus, overlay is an important factor in the yield, i.e. the percentage of correctly manufactured devices. Overlay is the accuracy within which layers are printed in relation to layers that have previously been formed. The overlay error budget will often be 10 nm or less, and to achieve such accuracy, the substrate must be aligned to the reticle pattern (and therefore to the reticle itself) to be transferred with great accuracy. Typically an IC has several tens of layers, and reticle alignment (aligning the reticle pattern with the wafer or wafer stage) should be performed for each layer of each substrate, so that the image of the new layer is correctly aligned with the previous images/layers. Any distortions, deformations or any other alignment errors can have a negative impact on overlay.

This reticle alignment is performed by projecting the radiation beam onto a grating on the reticle. The resultant radiation beams emitted by the plurality of openings in the grating pass through the projection lens system of the lithographic apparatus, such that an image of the grating is produced on a photosensitive device, which itself has already been (or will be) accurately aligned in relation to the substrate. The light intensity detected by the photosensitive device is dependent on the relative position of the grating (and therefore the reticle), relative to the photosensitive device (and therefore the substrate), such that a detected light intensity maximum indicates that the reticle and substrate are properly aligned. Alternatively, or in addition, methods may be used which detect light minima to indicate proper alignment in combination with inversed alignment marks on the reticle. An image of the projected grating as seen with the photosensitive device is referred to as an "aerial image", and extends in three dimensions.

In order to find the aligned position, a horizontal/vertical scan is performed in which, at each level of a defined number of z-levels, a move in the x-y plane is performed, centered approximately around the expected aligned position. The scan is performed as a continuous single scan back and forth over each z-level. A number of discrete samples are taken at sampling points along the scan path, either as a result of the radiation beam comprising a pulsed laser, or of the sampling being performed at discrete moments in time for continuous light sources.

Current state of the art is to measure the area in the vicinity of the aerial image in a linear manner with a discrete amount of z levels scanned in a linear manner. An issue with this type of scan is that all the relevant samples near the aligned position are measured within a short time period, which means that the measurement points are partly correlated, certainly for the low frequency range. Most of the noise impacting reticle alignment is at these low frequencies, resultant from low frequency disturbances in, for example, the liquid lens and the air along the optical path. Such disturbances might occur, for example, when different air and or water flows, each having different temperatures and or chemical components, are mixed.

A further issue with the type of scan described above is that the sampling is designed in such way that there are a number of particular frequencies in the higher frequency range at which the image sensor has a high sensitivity to measurement position noise. If a strong noise contribution is accidentally present at these frequencies, the image sensor performance during reticle alignment is significantly impaired.

SUMMARY

Consequently, it is desirable to improve the image sensor accuracy during reticle alignment by limiting the impact of low frequency noise disturbances on the reticle alignment performance and/or by limiting the impact of noise contributions at resonance frequencies of the lens, wafer stage, reticle stage etc. on the reticle alignment performance.

According to an aspect of the invention, there is provided a lithographic apparatus comprising: an illumination system configured to condition a radiation beam; a substrate table constructed to hold a substrate; an image sensor; a support constructed to support a patterning device, said apparatus being arranged to transfer a pattern from said patterning device onto said substrate, the patterning device further comprising at least one alignment structure for aligning the patterning device to the image sensor; and a projection system for projecting the radiation beam, said apparatus being operable to impart the radiation beam through the projection system onto said alignment structure so as to obtain a resultant aerial image, and scanning the image sensor in accordance with a scanning scheme, through a target volume containing said resultant aerial image so as to measure features of said image and thereby enable determination of the location of the alignment structure relative to the image sensor, wherein said scanning scheme is such that it increases the temporal separation of occasions where said image sensor passes through a substantially central portion of the target volume, when compared to performing a single continuous scan comprising a plurality of traverse passes at successive levels spaced through substantially the whole target volume.

According to an aspect of the invention, there is provided a device manufacturing method comprising transferring a pattern from a patterning device onto a substrate, said method further comprising aligning said patterning device and said substrate by performing the following steps: imparting a radiation beam onto an alignment structure on said patterning device so as to obtain a resultant aerial image; scanning an image sensor in accordance with a scanning scheme, through a target volume containing said resultant aerial image, the relative positions of said image sensor and said substrate being known or subsequently determined; and measuring features of said image and thereby determining of the location of the alignment structure relative to the image sensor, wherein said scanning scheme is such that it increases the temporal separation of occasions where said image sensor passes through a substantially central portion of the target volume, when compared to performing a single continuous scan comprising a plurality of traverse passes at successive levels spaced through substantially the whole target volume.

According to an aspect of the invention, there is provided a computer program product comprising program instructions operable to carry out the above described method when performed on suitable apparatus.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
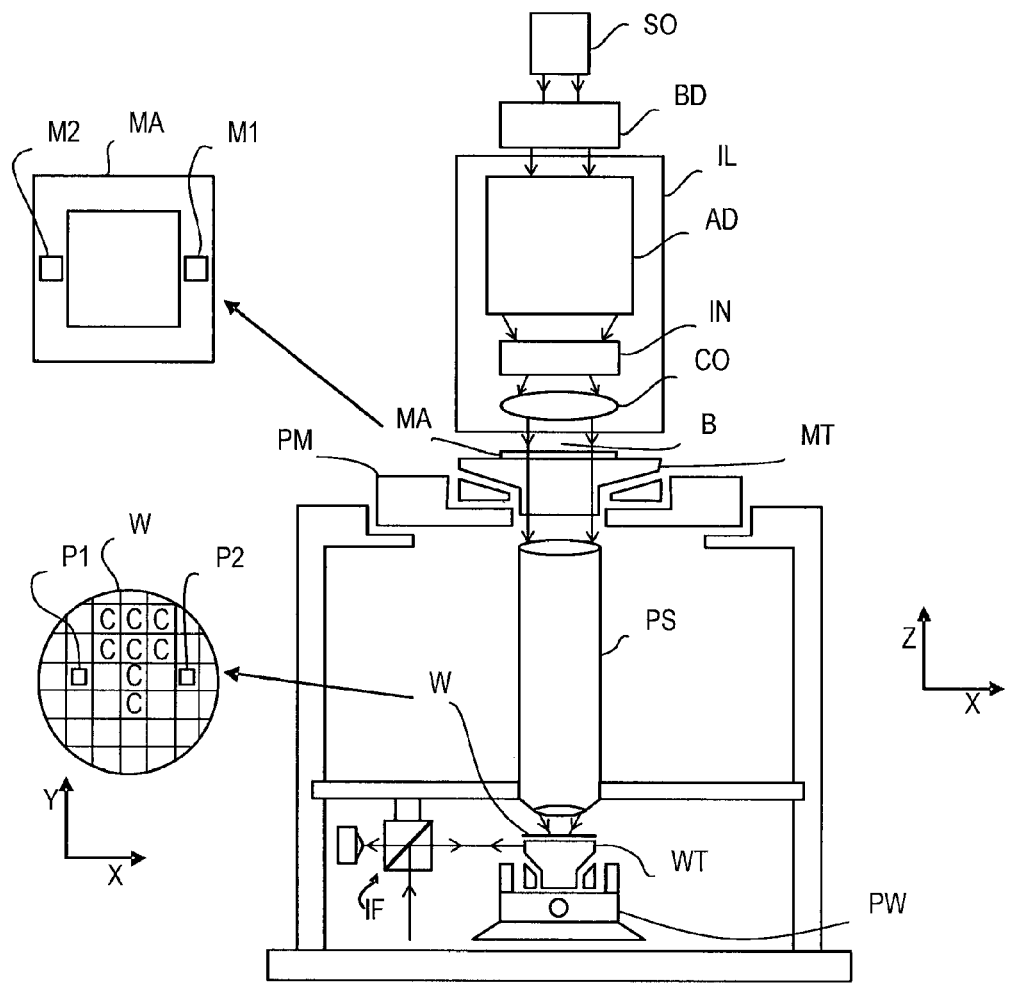
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid, the use of a vacuum, or the use of a combination of gasses. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, based on an encoder system or capacitive sensor), the substrate table WT can be moved accurately, e.g. so as to position different target portions C in the path of the radiation beam 13. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
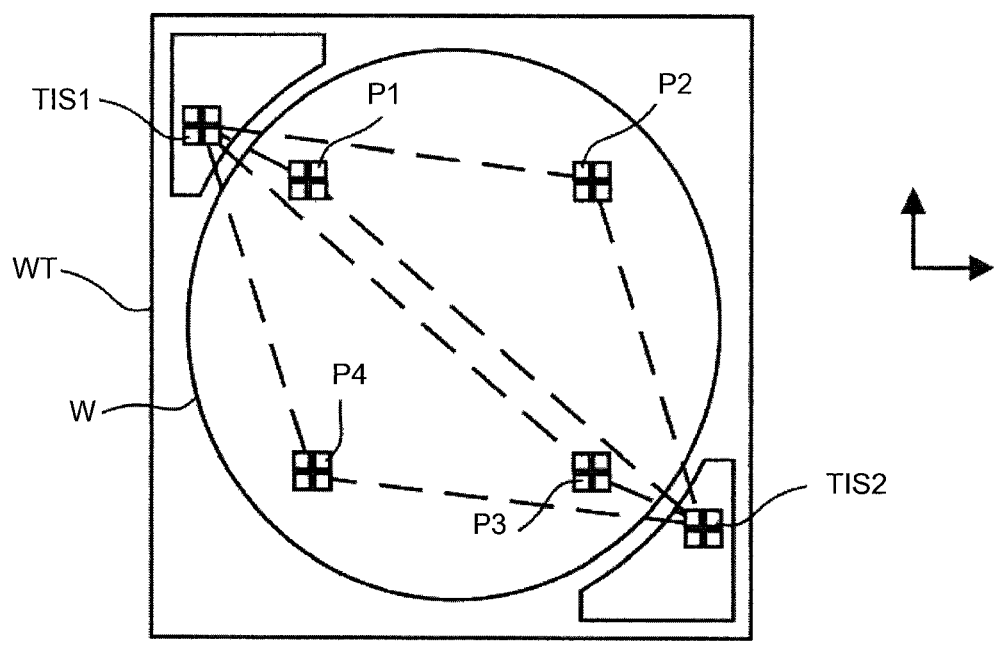
FIG. 2 schematically depicts a possible arrangement of the substrate table depicted in the lithographic apparatus of FIG. 1.

FIG. 2 schematically depicts an arrangement of the substrate table WT depicted in the lithographic apparatus of FIG. 1. On the substrate table WT, here two fixed marks TIS1 and TIS2 are provided. The fixed marks TIS1 and TIS2 have integrated into them a device for transmission image detection, also referred to as a transmission image detector or transmission image sensor. This transmission image sensor can be used to determine a location of an aerial image of an object mark on the mask MA by scanning the transmission image sensor through the aerial image. The transmission image sensor is substantially positioned in the substrate plane, i.e. the plane in which substrate W is located if positioned on the substrate table WT. Consequently, the relative position of the image of the object mark on the mask MA and the fixed marks TIS1, TIS2 can be determined. If the substrate table WT is provided with a substrate W comprising substrate marks, e.g. substrate marks P1, P2, P3, P4 as depicted in FIG. 2, an alignment sensor (not shown) may previously obtain relative positions of the substrate marks P1, P2, P3, P4. The knowledge of the relative positions of the substrate marks P1, P2, P3, P4 obtained by the alignment sensor combined with the knowledge of the relative position of the image of the object mark on the mask MA and the fixed marks TIS1, TIS2 measured by the transmission image sensors within TIS1, TIS2, allows the substrate W to be positioned at any desired position relative to the projected image of the mask MA in three orthogonal directions X, Y, and Z with great accuracy.

Figure 3:
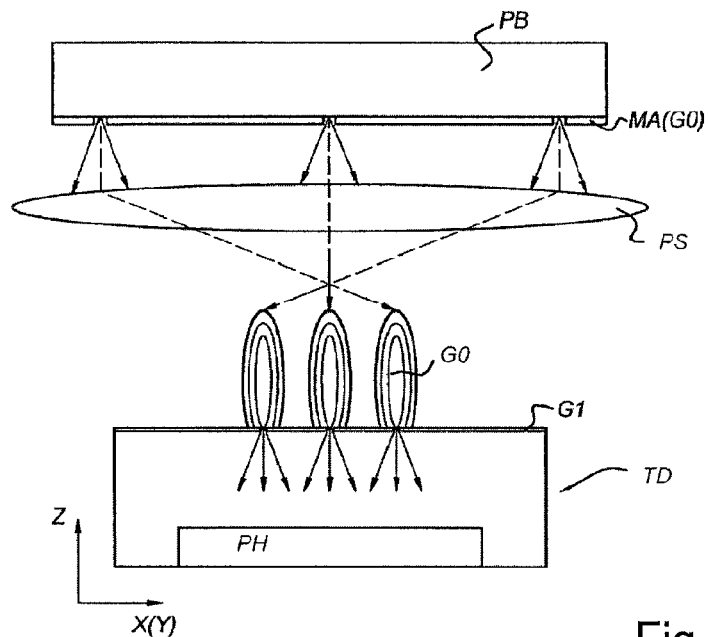
FIG. 3 depicts an example of a transmission image detector as depicted on the substrate table of FIG. 2.

FIG. 3 depicts schematically a transmission image sensor as mentioned above. The projection beam PB is incident on a first object G0, for example a grating on the mask MA. The first grating G0 comprises a plurality of openings arranged for creating an image from the projection beam PB. The openings in the first grating G0 each emit a radiation beam originating from the projection beam PB. The radiation beams emitted by the plurality of openings in G0, pass through a lens, for example, the projection lens system PS. The optical properties of such projection lens system are such that an image of G0, G0', is formed at a given plane below the projection lens system PS. The transmission image sensor TD is positioned below the projection lens system PS. The transmission image sensor TD comprises a slot pattern G1 and a photo sensor PH device. The slot pattern G1 is an opening over the photo sensor PH device which has the shape of a slit or a square. Advantageously, applying a pattern on the opening over the photo sensor PH device increases the number of edges which may increase the signal level and thus the signal/noise ratio of the photo sensor PH.

In order to determine the position of the object G0 on the mask MA in relation to the substrate W, the intensity of the image G0' can be mapped as a function of the XYZ position of the transmission image sensor. This mapping can be done by scanning along directions X, Y, and Z, for example in an image map (a 3D map), which comprises the coordinates of sampling locations and the intensity sampled at each location. From the 3D map, a computational device connected to the transmission image sensor TD can derive the position of the image by using, for example, a parabolic fit of the position indicating highest intensity, using a least squares fitting method, for example.

Figure 4:
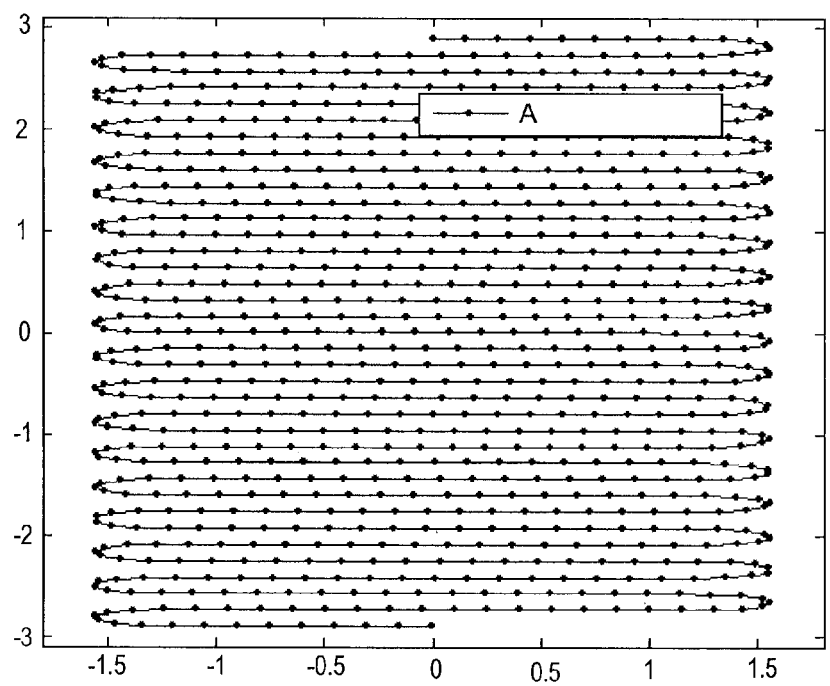
FIG. 4 illustrates a specific example of the path taken by a transmission image detector during a conventional single scan performed in a reticle alignment method.

FIG. 4 illustrates a specific example of such a conventional single scan A. The scan illustrated is a horizontal/vertical scan in which, at each level of a defined number of z-levels, a move in x and y is performed, centered around the expected aligned position. The scan is performed as a continuous single scan traversing back and forth over each z-level, each traverse being programmed as a straight line. The parameters, number of z-levels, the number of sampling points per z-level, and the size of the area of scanning, are defined by the aerial image G0' size (depending on illumination setting and width of marks) and the capture range (accuracy of the knowledge where the aerial image G0' is located).

Figure 5:
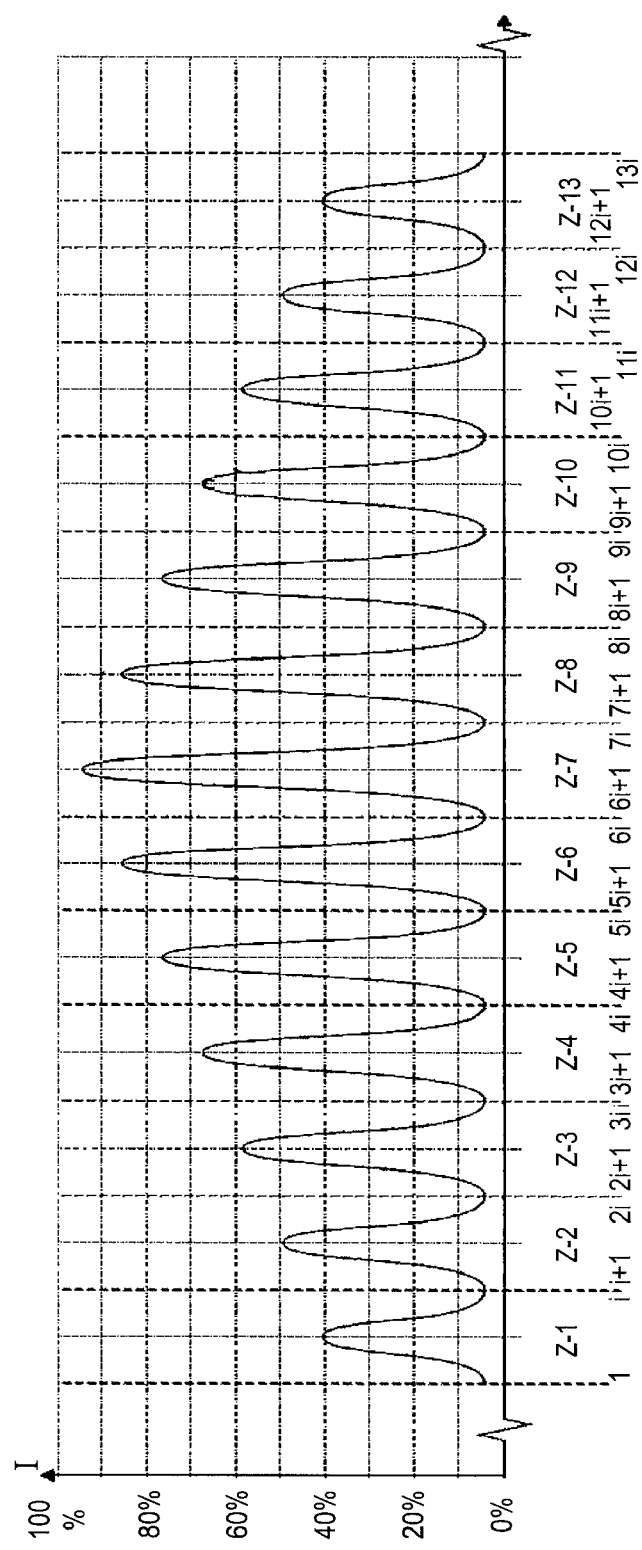
FIG. 5 shows an example of the resultant intensity profile recorded on the transmission image detector during a scan of the type illustrated in FIG. 4.

FIG. 5 shows an example of the resultant intensity profile versus time after such a scan over 13 z-levels (Z-1 to Z-13), with i samples per level. The periods of time corresponding to scans Z-1 to Z1-3 are marked along the bottom axis. Within each of these passes, a distinct peak of intensity can be seen. The central peak in each pass corresponds to the aligned position in the X/Y direction at a certain focus level Z. The central peak in each pass corresponds a maximum amount of radiation to impinge on photosensor PH at a certain focus level Z. Among different passes, it can be seen that the intensity peaks corresponding to pass Z-7 are the highest. Accordingly, by simple signal processing aligned position in the X/Y direction can be determined at best focus, wherein the best focus (Z) position is determined by the Z-7 level.

By correlating the positions of this highest central peak with movement signals received from the positioning subsystem which drives the substrate table WT, a datum can be established, by which, in principle, any position of the substrate table and substrate W can be achieved with respect to the aerial image of the patterning device.

The aerial image G0' can be described with a position dependent function. This function $F(\vec{x})$ is reconstructed during reticle align by sampling: $F(\vec{x}_1) \ldots F(\vec{x}_n)$, n being the number of samples. Taking into account the position disturbances $\delta_i$, the function $F(\vec{x})$ is reconstructed from $F(\vec{x}_1 + \vec{\delta}_1) \ldots F(\vec{x}_n + \vec{\delta}_n)$. The position disturbances can cause this reconstruction of the aerial image function to result in an inaccurate aligned position. In the first order for one disturbance it can be shown that:

$$\langle \Delta F \rangle \sim \sum_i \left. \frac{\partial F(\vec{x}_i)}{\partial \vec{x}_i} \right|_{\vec{x}_i} \vec{\delta}_i$$

disregarding all cross terms. Ideally $\langle \Delta F \rangle$ is to be minimized by developing an optimum detection scheme.

Consider a situation where any inaccuracies are known to result from linear drift of the position disturbances versus time. In such a situation the position disturbance can be described as: $\vec{\delta}_n = n\vec{\alpha}t$, and performing a scan in one direction and taking the same route back will result in an accurate aligned position. This is because the sum of the position disturbances times the sensitivity for these disturbances is zero. Similarly, in case of a known periodic position disturbance versus time, the position disturbance can be described as follows: $\vec{\delta}_n = \vec{\alpha} \sin(n\omega t)$. Therefore theoretically, by performing a scan for a duration which is an integer multiple of the period of the disturbance, the sum of the position disturbances times its sensitivity is zero. The effect of theses position disturbances could then be removed by taking an even amount of measurement samples which are spaced half the period of the oscillation after each other.

Realistically however, disturbances will be unknown and/or complex. For unknown disturbances it is not possible to tailor a specific scan method as with the theoretical examples above. Therefore the solution proposed is to essentially "randomize" in some way the position sampling to minimize the impact of the sum of the individual position errors of all samples when fitting the aerial image function. However a completely random scan (although within the scope of the invention) is not ideal due to difficulty in controlling the hardware, and in ensuring complete scan coverage of the substrate.

Therefore, in one embodiment it is proposed to replace the conventional single scan performed continuously over all z-levels with a number of scans of shorter duration, such that the total scan duration is the same or shorter than the scan duration of the conventional single scan. It should be appreciated, however, that it is not outside the scope of the invention to perform a number of shorter duration scans that have a total duration longer than the conventional single scan previously described, should further improved accuracy at the cost of throughput be desired.

It may be that each shorter scan is random, or pseudo-random, in respect of one or more parameters, including, for example, starting point, initial scan direction and/or the scan path taken. In respect of the last factor, instead of programming each pass to be performed in a straight line, a different pass path may be programmed, or the path itself may be (pseudo-)randomized, so that a random direction is taken after each sample, or every few samples, for example.

In one embodiment it is proposed to replace the conventional single scan with a finite number of at least partially overlapping shorter scans which can each have different parameters. For example, while the conventional single scan may be 20 ms in duration, examples of overlapping shorter scans may include two 10 ms scans or a 8 ms scan and a 12 ms scan or a 7 ms scan, a 5 ms scan and two 4 ms scans. Clearly there are virtually limitless variations on these examples which also fall within the scope of the invention. In all cases each scan may only cover a portion of the volume of that covered by a conventional single scan, or else they might all cover approximately the same volume (each scan then covering that same volume taking less samples/levels), or any combination of these options. At least two of the shorter scans should overlap approximately, at least insofar as they travel through approximately the same volume space.

Figure 6:
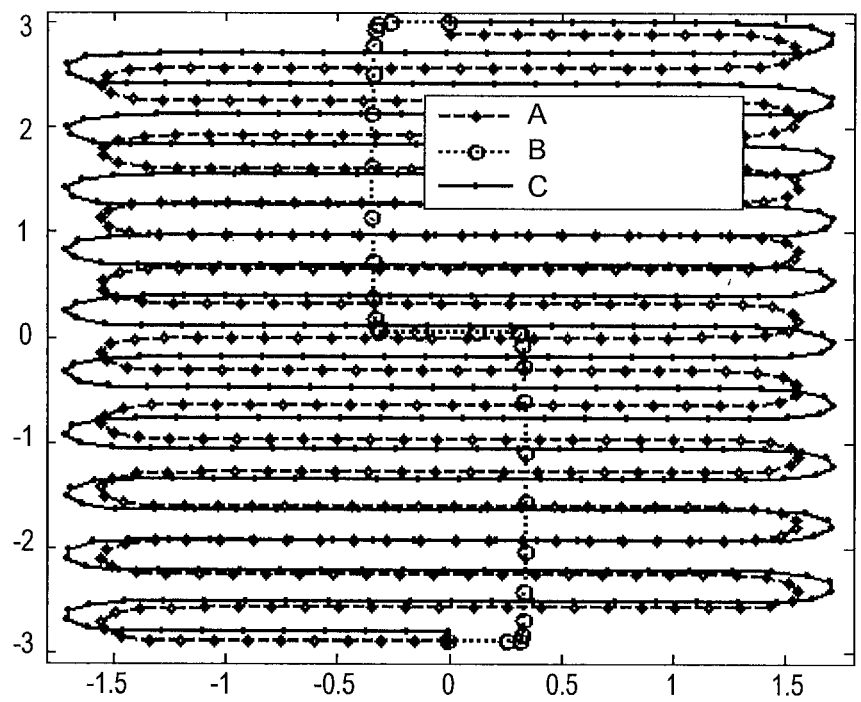
FIG. 6 shows a specific example of the path taken by a transmission image detector during two overlapping single scans, with a connection move between the two scans performed during a reticle alignment method according to an embodiment of the invention.

FIG. 6 shows a plot of z-position against x and y position for a specific example of two overlapping single scans, a first scan A and second scan C, with a connection move B between the two scans. It can be seen that both scans A and C in this example essentially cover the same volume space as the conventional single scan of FIG. 4. However, in each case the scan is less thorough than the conventional single scan, with fewer samples taken over fewer levels.

Figure 7A:
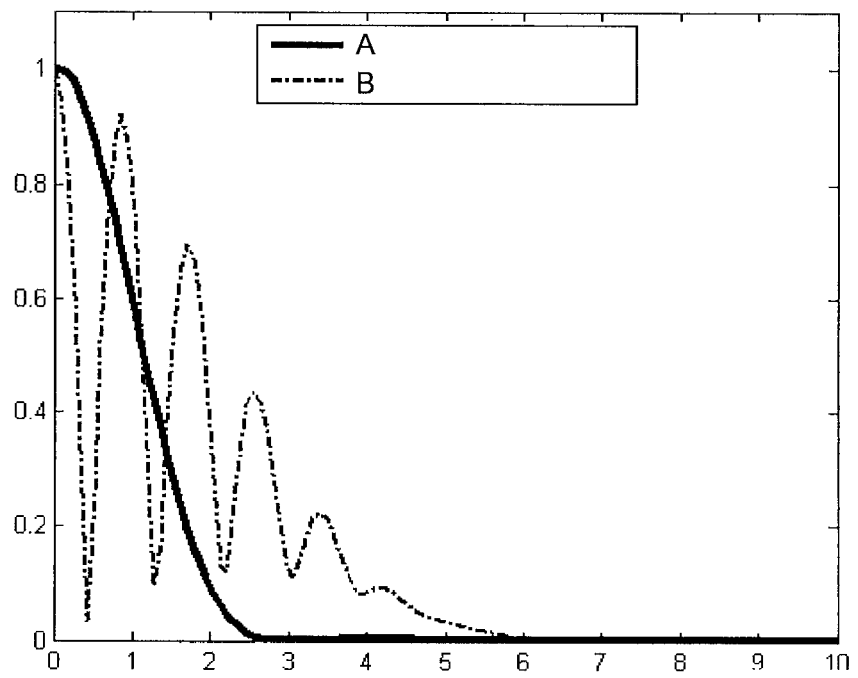
FIG. 7a is a graph of the noise to reproduction sensitivity against frequency at the low frequency range for the reticle alignment method depicted in FIG. 4 and FIG. 6.
Figure 7B:
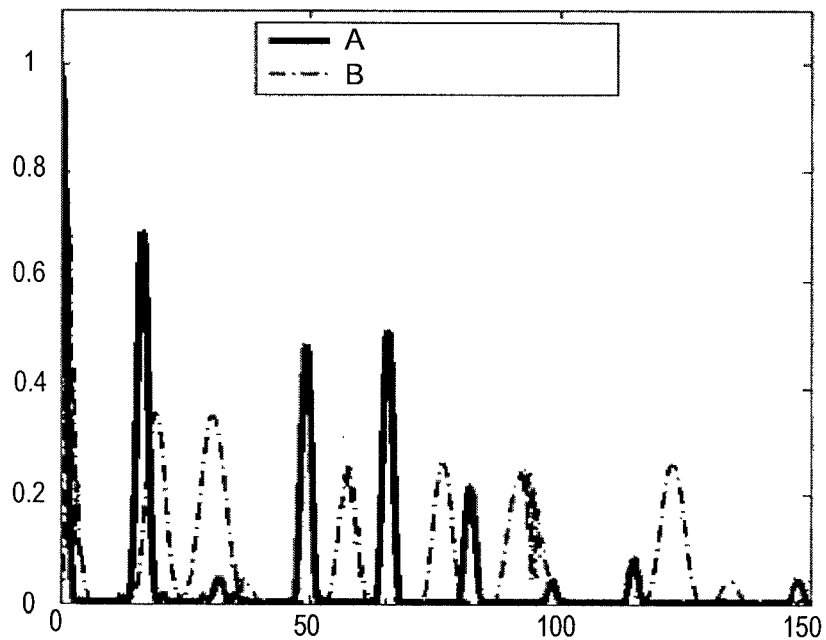
FIG. 7b is the same graph as FIG. 7a at higher frequencies.

FIGS. 7a and 7b illustrate the effect of the two scan method depicted in FIG. 6 compared to the conventional single scan of FIG. 4. FIG. 7a shows a graph of the sensitivity against frequency for the low frequency range for a conventional scan A and two shorter scans B, while FIG. 7b shows the same graph for higher frequencies. As explained in the introduction, reticle alignment inaccuracy is for a significant part caused by low frequency noise. Furthermore, noise sensitivity spikes at specific higher frequencies can have a detrimental effect on the reticle alignment accuracy.

Looking first at FIG. 7a, it can be shown that the general noise pattern at low frequencies, resultant from the conventional single scan method A, behaves as one over frequency (1/f) noise. If the scan time were to be increased the slope of the sensitivity for the low frequency part of the trace would be steeper. However, major noise contributions will still be present in the low frequency region. As a consequence, by applying the total scan for reticle alignment in a finite number of scans (two in this example) over the same amount of time as a conventional single scan, it can be seen from the graph of FIG. 7a that the low frequency sensitivity curve oscillates between the nominal sensitivity and zero sensitivity. When this oscillating sensitivity curve is multiplied with the typical noise scheme of immersion scanners, a net lower inaccuracy results, compared to the conventional single scan sensitivity curve. The reason for this can also be understood by considering the fact that the measurement points close to the aligned position (and used for the fit) are "smeared" out over a greater time period which results in less correlated measurement samples and therefore an improvement in the reticle alignment accuracy.

Looking now at FIG. 7b it can be seen that the conventional single scan A results in the sharp sensitivity peaks as discussed previously. However, it can also be seen that as a result of choosing a finite number of different pass methods to sample the aerial image in the vicinity of the aligned position (e.g. different parameters chosen for each scan, and further samples taken in the connection move), the strong noise sensitivity maxima are different for each different pass method. This therefore results in a flatter sensitivity profile B versus frequency. A flatter sensitivity profile having the same or similar integral value compared to a sensitivity profile having a small number of maxima means that the reticle alignment becomes more robust for intrinsic oscillations (wafer stage, reticle stage, lens, etc) or accidentally occurring oscillations. By performing several scans with a different duration the robustness of the reticle alignment increases even further since each of these scans will show a different sensitivity as a function of the frequency which results in a lower total sensitivity.

Figure 8:
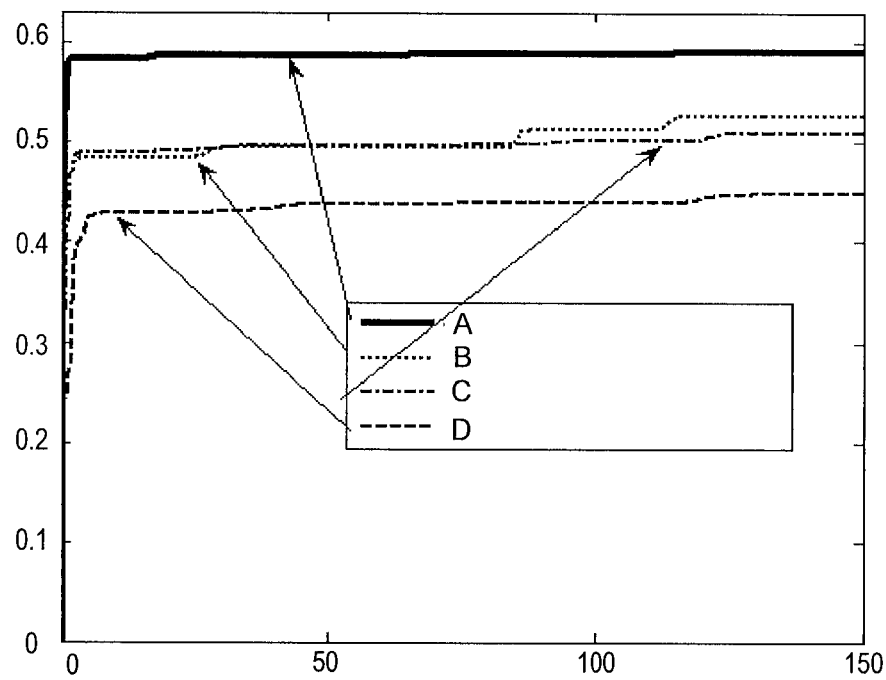
FIG. 8 is a graph of the horizontal cumulative noise contribution for a typical example of noise contribution versus frequency for the for the reticle alignment methods depicted in FIG. 4 and FIG. 6, and two further methods according to further embodiments of the invention.

FIG. 8 is a graph of the cumulative noise contribution versus frequency for the conventional single scan A and for the three specific examples mentioned earlier, that is two 10 ms scans B; a 8 ms scan and a 12 ms scan C; and a 7 ms scan, a 5 ms scan and two 4 ms scans D. It can be seen that all three of the non-continuous scans show less cumulative noise impact than for the conventional single scan, therefore showing that the methods described herein can also result in less noise impact overall, thus improving the reproducibility of reticle alignment.

Figure 9:
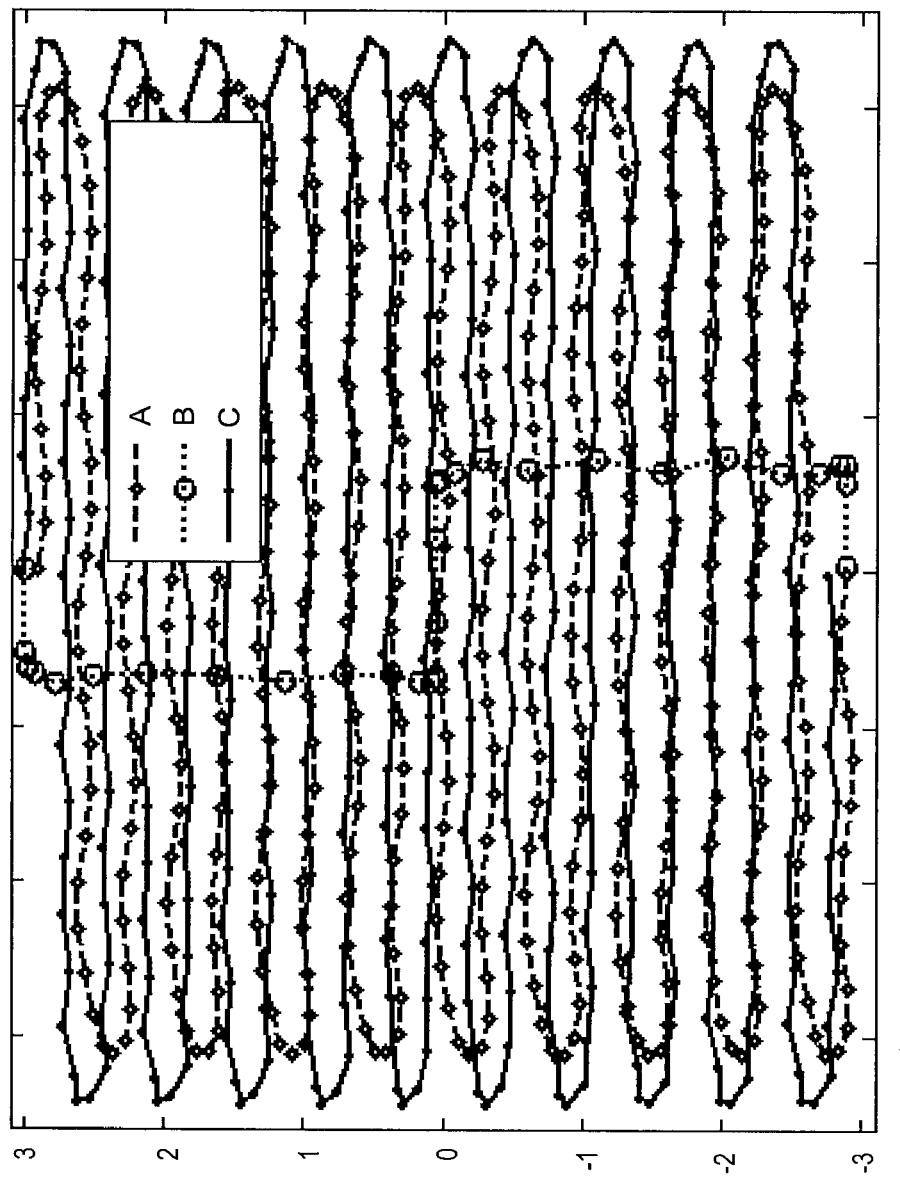
FIG. 9 shows a variation on the path taken by a transmission image detector during the two scan embodiment of FIG. 6.

FIG. 9 shows a variation on the two scan embodiment of FIG. 6. Again there are two overlapping single scans, a first scan A and second scan C, with a connection move B between the two scans. In this case it has been deliberately programmed for each traverse (at each level) not to be straight, but to follow a wavy path (of course any path profile may be used). In doing this, further improved results can be obtained, with noise further reduced and/or sensitivity profile further flattened.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 1-50 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. For example, the above description has been described using the example of position disturbances, however the concepts disclosed can also be applied to other disturbances such as those resultant from power and temperature variations. It will be apparent to one skilled in the art that modifications may be made to the invention as described without departing from the scope of the embodiments set out below:

1. A lithographic apparatus comprising: an illumination system configured to condition a radiation beam; a substrate table constructed to hold a substrate; an image sensor; a support constructed to support a patterning device, said apparatus being arranged to transfer a pattern from said patterning device onto said substrate, the patterning device further comprising at least one alignment structure for aligning the patterning device to the image sensor; and a projection system for projecting the radiation beam, said apparatus being operable to impart the radiation beam through the projection system onto said alignment structure so as to obtain a resultant aerial image, and scanning the image sensor in accordance with a scanning scheme, through a target volume containing said resultant aerial image so as to measure features of said image and thereby enable determination of the location of the alignment structure relative to the image sensor, wherein said scanning scheme is such that it increases the temporal separation of occasions where said image sensor passes through a substantially central portion of the target volume, when compared to performing a single continuous scan comprising a plurality of traverse passes at successive levels spaced through substantially the whole target volume.

2. A lithographic apparatus as described in embodiment 1, operable such that said alternative scanning scheme comprises a plurality of scans, each scan comprising a plurality of traverse passes at successive levels spaced through at least a portion of the target volume.

3. A lithographic apparatus as described in embodiment 2, operable such that at least two of the scans each comprise a plurality of traverse passes at successive levels spaced through substantially the same portion of said target volume.

4. A lithographic apparatus as described in embodiment 3, operable such that at least two of the scans each comprise a plurality of traverse passes at successive levels spaced through substantially the whole of the target volume.

5. A lithographic apparatus as described in embodiment 2, 3 or 4, wherein at least two of said scans are each of a different duration.

6. A lithographic apparatus as described in any of the embodiments 2 to 5, operable such that the total duration of said plurality of scans does not exceed the total duration of a conventional single continuous scan of similar precision.

7. A lithographic apparatus as described in any of the embodiments 2 to 6, operable such that the total duration of said plurality of scans for a fine precision is in the region of 10-500 ms.

8. A lithographic apparatus as described in any of the embodiments 2 to 7, operable such that any connecting moves adjoining consecutive scans pass through a substantially central portion of said target volume.

9. A lithographic apparatus as described in embodiment 8, operable such that said connecting moves deviate from a direct path between the end of one scan and the beginning of the next, so as to maximize travel within said substantially central portion of said target volume.

10. A lithographic apparatus as described in any of the embodiments 2 to 9, operable such that, for at least one of said plurality of scans, each traverse is programmed to deliberately deviate from a straight line.

11. A lithographic apparatus as described in embodiment 1, operable such that said target volume is scanned in the horizontal and vertical directions in a pseudo-randomized manner.

12. A lithographic apparatus of any preceding embodiment, operable such that the relative location of said image sensor and said substrate is also determined.

13. A device manufacturing method comprising transferring a pattern from a patterning device onto a substrate, said method further comprising aligning said patterning device and said substrate by performing the following steps: imparting a radiation beam onto an alignment structure on said patterning device so as to obtain a resultant aerial image; scanning an image sensor in accordance with a scanning scheme, through a target volume containing said resultant aerial image, the relative positions of said image sensor and said substrate being known or subsequently determined; and measuring features of said image and thereby determining of the location of the alignment structure relative to the image sensor; wherein said scanning scheme is such that it increases the temporal separation of occasions where said image sensor passes through a substantially central portion of the target volume, when compared to performing a single continuous scan comprising a plurality of traverse passes at successive levels spaced through substantially the whole target volume.

14. A device manufacturing method as described in embodiment 13, wherein said alternative scanning scheme comprises a plurality of scans, each scan comprising a plurality of traverse passes at successive levels spaced through at least a portion of the target volume.

15. A device manufacturing method as described in embodiment 14, wherein at least two of the scans each comprise a plurality of traverse passes at successive levels spaced through substantially the same portion of said target volume.

16. A device manufacturing method as described in embodiment 15, wherein at least two of the scans each comprise a plurality of traverse passes at successive levels spaced through substantially the whole of the target volume.

17. A device manufacturing method as described in embodiment 14, 15 or 16, wherein at least two of said scans are each of a different duration.

18. A device manufacturing method as described in any of the embodiments 14 to 17 wherein the total duration of said plurality of scans does not exceed the total duration of a conventional single continuous scan of similar precision.

19. A device manufacturing method as described in any of the embodiments 14 to 18, wherein the total duration of said plurality of scans for a fine precision is in the region of 10-500 ms.

20. A device manufacturing method as described in any of the embodiments 14 to 19, wherein any connecting moves adjoining consecutive scans pass through a substantially central portion of said target volume.

21. A device manufacturing method as described in embodiment 20, wherein said connecting moves deviate from a direct path between the end of one scan and the beginning of the next, so as to maximize travel within said substantially central portion of said target volume.

22. A device manufacturing method as described in any of the embodiments 14 to 21, wherein, for at least one of said plurality of scans, each traverse is programmed to deliberately deviate from a straight line.

23. A device manufacturing method as described in any of the embodiments 13 to 22, wherein said target volume is scanned in the horizontal and vertical directions in a pseudo-randomized manner.

24. A computer program product comprising program instructions operable to carry out the method as described in any of the embodiments 13 to 23 when performed on a suitable apparatus.

25. A machine readable medium having machine executable instructions for operating a lithographic apparatus in accordance with the method as described in any of the embodiments 13 to 23.

The invention claimed is:

1. A lithographic apparatus comprising:
an illumination system configured to condition a radiation beam;
a substrate table constructed to hold a substrate;
an image sensor;
a support constructed to support a patterning device, said apparatus being arranged to transfer a pattern from said patterning device onto said substrate, the patterning device further comprising at least one alignment structure for aligning the patterning device to the image sensor; and
a projection system for projecting the radiation beam,
said apparatus being operable to impart the radiation beam through the projection system onto said alignment structure so as to obtain a resultant aerial image, and comprises a non-transitory medium containing machine executable instructions to cause the apparatus to scan the image sensor in accordance with a scanning scheme, through a target volume containing said resultant aerial image so as to measure features of said image and thereby enable determination of the location of the alignment structure relative to the image sensor,
wherein said scanning scheme comprises scanning the image sensor through the target volume to obtain a single alignment measurement the scanning scheme further comprising a plurality of scans, each scan comprising a plurality of traverse passes at successive levels spaced through at least a portion of the target volume and in which at least two of the scans at least partially overlap, traversing a same portion of the target volume while measuring said features of said image.

2. A lithographic apparatus in accordance with claim 1, operable such that at least two of the scans each comprise a plurality of traverse passes at successive levels spaced through substantially the same portion of said target volume.

3. A lithographic apparatus in accordance with claim 2, operable such that at least two of the scans each comprise a plurality of traverse passes at successive levels spaced through substantially the whole of the target volume.

4. A lithographic apparatus in accordance with claim 1, wherein at least two of said scans are each of a different duration.

5. A lithographic apparatus in accordance with claim 1, operable such that any connecting moves adjoining consecutive scans pass through a substantially central portion of said target volume.

6. A lithographic apparatus in accordance with claim 5, operable such that said connecting moves deviate from a direct path between the end of one scan and the beginning of the next, so as to maximize travel within said substantially central portion of said target volume.

7. A lithographic apparatus in accordance with claim 1, operable such that, for at least one of said plurality of scans, each traverse is programmed to deliberately deviate from a straight line.

8. A lithographic apparatus in accordance with claim 1, operable such that said target volume is scanned in the horizontal and vertical directions in a pseudo-randomized manner.

9. A device manufacturing method comprising transferring a pattern from a patterning device onto a substrate, said method further comprising aligning said patterning device and said substrate by:
imparting a radiation beam onto an alignment structure on said patterning device so as to obtain a resultant aerial image;
performing a single scan of an image sensor in accordance with a scanning scheme, through a target volume containing said resultant aerial image, the relative positions of said image sensor and said substrate being known or subsequently determined; and
measuring features of said image and thereby determining of the location of the alignment structure relative to the image sensor, wherein said scanning scheme comprises scanning the image sensor through the target volume to obtain a single alignment measurement wherein the scanning scheme further comprises a plurality of scans, each scan comprising a plurality of traverse passes at successive levels spaced through at least a portion of the target volume and in which at least two of the scans at least partially overlap, traversing a same portion of the target volume while measuring said features of said image.

10. A device manufacturing method in accordance with claim 9, wherein at least two of the scans each comprise a plurality of traverse passes at successive levels spaced through substantially the same portion of said target volume.

11. A device manufacturing method in accordance with claim 10, wherein at least two of the scans each comprise a plurality of traverse passes at successive levels spaced through substantially the whole of the target volume.

12. A device manufacturing method in accordance with claim 9, wherein at least two of said scans are each of a different duration.

13. A device manufacturing method in accordance with claim 9, wherein any connecting moves adjoining consecutive scans pass through a substantially central portion of said target volume.

14. A device manufacturing method in accordance with claim 13, wherein said connecting moves deviate from a direct path between the end of one scan and the beginning of the next, so as to maximize travel within said substantially central portion of said target volume.

15. A device manufacturing method in accordance with claim 10, wherein, for at least one of said plurality of scans, each traverse is programmed to deliberately deviate from a straight line.

16. A device manufacturing method in accordance with claim 9, wherein said target volume is scanned in the horizontal and vertical directions wherein a scanning parameter for each scan is selected in a pseudo-randomized manner.

* * * * *